(12) United States Patent
Luchinger et al.

(10) Patent No.: US 9,911,917 B2
(45) Date of Patent: Mar. 6, 2018

(54) ELECTRONIC DEVICES COMPRISING SOLUTION-PROCESSABLE METAL OXIDE BUFFER LAYERS

(71) Applicant: Avantama AG, Stafa (CH)

(72) Inventors: Norman Albert Luchinger, Meilen (CH); Samuel Claude Halim, Meilen (CH); Tobias Stubhan, Nuremberg (DE); Christoph J. Brabec, Erlangen (DE)

(73) Assignee: Avantama AG, Stafa (CH)

( * ) Notice: Subject to any disclaimer, the term of this patent is extended or adjusted under 35 U.S.C. 154(b) by 0 days.

(21) Appl. No.: 15/178,960

(22) Filed: Jun. 10, 2016

(65) Prior Publication Data

US 2016/0351808 A1    Dec. 1, 2016

Related U.S. Application Data

(63) Continuation-in-part of application No. PCT/CH2014/000148, filed on Oct. 9, 2014.

(30) Foreign Application Priority Data

Dec. 12, 2013   (EP) .................................... 13005798

(51) Int. Cl.
*H01L 51/00* (2006.01)
*C09D 7/12* (2006.01)
(Continued)

(52) U.S. Cl.
CPC ........ *H01L 51/0001* (2013.01); *C09D 7/1216* (2013.01); *C09D 7/1233* (2013.01);
(Continued)

(58) Field of Classification Search
None
See application file for complete search history.

(56) References Cited

U.S. PATENT DOCUMENTS 5,414,103 A * 5/1995 Cracknell ............ C08G 65/327
                                                                508/428
6,051,627 A      4/2000  Thetford et al.
(Continued)

FOREIGN PATENT DOCUMENTS

| EP | 2 157 053 A1 | 2/2010 |
| WO | 2006/092443 A1 | 9/2006 |
| WO | 2013007716 A1 | 1/2013 |

OTHER PUBLICATIONS

Faure, Bertrand, German Salazar-Alvarez, Anwar Ahniyaz, Irune Villaluenga, Gemma Berriozabal, Yolanda R De Miguel, and Lennart Bergstrom. "Dispersion and Surface Functionalization of Oxide Nanoparticles for Transparent Photocatalytic and UV-protecting Coatings and Sunscreens." Science and Technology of Advanced Materials 14.2 (2013): 023001.*
(Continued)

*Primary Examiner* — Joseph Schoenholtz
(74) *Attorney, Agent, or Firm* — Renner, Otto, Boisselle & Sklar, LLP (57) ABSTRACT

The present invention relates to the field of electronic devices, such as organic electronics, wherein said device includes a substrate and a multitude of layers, wherein at least one of said layers is a buffer layer, wherein said buffer layer includes metal oxide nanoparticles coated with dispersant as described in the specification. The invention further provides for electronic device component and materials suitable for manufacturing such electronic devices, to specific manufacturing methods and to specific uses.

27 Claims, 3 Drawing Sheets

(51) Int. Cl.
*H01L 51/44* (2006.01)
*H01L 51/42* (2006.01)

(52) U.S. Cl.
CPC ........ *C09D 7/1266* (2013.01); *H01L 51/0004* (2013.01); *H01L 51/0034* (2013.01); *H01L 51/4273* (2013.01); *H01L 51/442* (2013.01); *H01L 51/0047* (2013.01); *H01L 51/0094* (2013.01); *H01L 51/424* (2013.01); *H01L 2251/303* (2013.01); *H01L 2251/5369* (2013.01); *Y02E 10/549* (2013.01); *Y02P 70/521* (2015.11)

(56) References Cited

U.S. PATENT DOCUMENTS

| | | | |
|---|---|---|---|
| 6,133,366 A | 10/2000 | Thetford et al. | |
| 6,562,897 B1* | 5/2003 | Thetford | C08G 63/664 524/547 |
| 6,649,156 B1* | 11/2003 | Chane-Ching | A61K 8/19 106/14.44 |
| 8,097,742 B2 | 1/2012 | Ying et al. | |
| 2007/0289626 A1 | 12/2007 | Brabec et al. | |
| 2008/0299382 A1 | 12/2008 | Moon et al. | |
| 2009/0243477 A1 | 10/2009 | Saneto et al. | |
| 2010/0150513 A1 | 6/2010 | Zhang et al. | |
| 2011/0114925 A1 | 5/2011 | Hsu et al. | |
| 2012/0111403 A1 | 5/2012 | Ahn et al. | |
| 2012/0222885 A1* | 9/2012 | Mak | H01L 51/5212 174/126.1 |

OTHER PUBLICATIONS

Lai, Tzung-Han, Sai-Wing Tsang, Jesse R. Manders, Song Chen, and Franky So. "Properties of Interlayer for Organic Photovoltaics." Materials Today 16.11 (2013): 424-32.*

QLED Introduction downloaded from URL<http://www.qled-info.com/introduction/> on May 30, 2017.*
Stubhan, T., et. al., "Inverted Organic Solar Cells Using a Solution Processed Aluminium-doped Zinc Oxide Buffer Layer", Organic Electronics 12 (2011) 1539-1543.*
International Search Report for co-pending International Application No. PCT/CH2014/000148 dated Dec. 15, 2014.
Written Opinion of the International Searching Authority for co-pending International Application No. PCT/CH2014/000148 dated Dec. 15, 2014.
Geffroy et al., Organic light-emitting diode (OLED) technology: materials, devices and display technologies:, Polymer International, vol. 55, 2006, pp. 572-582.
Protesescu et al., "Nanocrystals of Cesium Lead Halide Perovskites (CsPbX3, X=Ci, Br, and I): Novel Dptoelectronic Materials Showing Bright Emission with Wide Color Gamut", Nano Letters, Dec. 19, 2014, pp. A-E.
Puetz et al., "Organic solar cells incorporating buffer layers from indium doped zinc oxide nanoparticles", Solar Energy Materials & Solar Cells, vol. 95, 2011, pp. 579-585.
Stubhan et al., "Inverted organic solar cells using a solution processed aluminum-doped zinc oxide buffer layer", Organic Electronics, vol. 12, 2011, pp. 1539-1543.
Stubhan et al., "High fill factor polymer solar cells comprising a transparent, low temperature solution processed doped metal oxide/metal nanowire composite electrode", Solar Energy Materials & Solar Cells, vol. 107, 2012, pp. 248-251.
Stubhan et al., "Increasing the Fill Factor of Inverted P3HT:PCBM Solar Cells Through Surface Modification of Al-Doped ZnO via Phosphonic Acid-Anchored C60 SAMs", Advanced Energy Materials, vol. 2, 2012, pp. 532-535.
Yip et al., "Polymer Solar Cells That Use Self-Assembled-Monoloayer-Modified ZnO/Metals as Cathodes", Advanced Materials, vol. 20, 2008, pp. 2376-2382.
Ma et al., "Interface Engineering for Organic Electronics", Advanced Functional Materials, vol. 20, 2010, pp. 1371-1388.

* cited by examiner

ELECTRONIC DEVICES COMPRISING SOLUTION-PROCESSABLE METAL OXIDE BUFFER LAYERS

This application is a continuation-in-part of International Application No. PCT/CH2014/000148, filed Oct. 9, 2014 and published in the English language, which claims priority to EP 13005798.7, filed Dec. 17, 2013.

TECHNICAL FIELD

The present invention relates to the field of electronic devices, particularly organic electronics. The invention further provides electronic device component and materials suitable for manufacturing such electronic devices, the invention also provides for specific manufacturing methods and for specific uses.

BACKGROUND

It is known to use buffer layers in organic electronics, such as organic light emitting diodes (OLED) or organic photovoltaic cells (OPV), in order to increase device efficiency and life-time. Such buffer layers comprise metal oxides, such as ZnO, TiOx, WOx, NiO, NbyOx, or doped metal oxides, such as Al-doped ZnO ("AZO"). Generally, such metal oxides in particulate form are known. Typically, the above named oxidic buffer layers are manufactured by thermal evaporation under high vacuum; which is disadvantageous in terms of low-cost, large-area manufacturing processing.

It is also known that polymer solar cells (OPV) offer a promising approach for a low-cost and flexible photovoltaic technology with certified efficiencies exceeding 10%. Before widespread commercialization, large area production and stability issues have to be solved. For the reliable large area production with high yield and low shunts, thick, stable, robust and printable buffer layers are a prerequisite.

It is also known to use channel layers in transistors, particularly in TFTs. Such channel layers comprise metal oxides, such as ZnO, or mixed oxides, such as indium zinc oxide (ZITO), indium gallium zinc oxide (IGZO) or ZnSnO3. Generally, such metal oxides in particulate form are known. As discussed above, such oxidic layers are manufactured by thermal evaporation under high vacuum; which is disadvantageous in terms of low-cost, large-area manufacturing processing.

Leidolph et al. (EP2157053) describe specific ZnO particles, which are optionally coated, and the manufacturing thereof. It is further speculated about the use of such particles, for example in solar cells.

Rohe et al. (WO2006/092443) describe surface-modified ZnO particles and the manufacturing thereof. It is further speculated about the use of such particles in photogalvanic and photoelectric cells.

Yip et al. (Adv. Mater., 2008, 20, 2376-2382) report on a solution-processed nanoparticulate ZnO buffer layer in organic solar cells. The coating liquid is a suspension of unmodified ZnO nanoparticles in 1-butanol. This suspension was applied on organic layers without damaging them and secondly, a temperature post-treatment of <100° C. was sufficient. Direct contact of the deposited ZnO layer with a silver electrode resulted in low performance devices with low fill factors. In order to improve the contact between the ZnO and the silver, Yip et al apply a self assembled monolayer (SAM) at the interface ZnO/Ag. Application of a SAM layer includes a separate and additional processing step, which is considered disadvantageous.

Stubhan et al. (Solar Energy Materials & Solar Cells, 107 (2012), 248-251) report on solution-processed AZO ETL layers which are produced by a sol-gel technique. A temperature treatment of such layers below 150° C. is sufficient in order to obtain high performance organic solar cells. But still, this material is limited to inverted device architectures because deposition of the sol-gel precursor liquid on top of an active organic layer will damage this layer. This disadvantageous effect is shown in the present application (see examples for the sol-gel produced AZO (LT-AZO). Stubhan et al (Adv. Energy Mater. 2012, 532-535) further disclose methods for increasing the fill factor of inverted solar cells using specific phosphonic anchored SAMs. As apparent from that document, FIG. 1, the AZO nanoparticles are not coated. Rather, a further SAM-layer comprising specific phosphates on top of the AZO nanoparticles applied. Although these layers also result in good PCE values, manufacturing of the devices is difficult, due to the extra coating to obtain a SAM layer.

Brabec (US2007/0289626) discusses photovoltaic cells comprising electrodes with conductive particles. However, this document does not provide any specific teachings of such particles, it broadly suggests its use as component of a photovoltaic cell's electrode.

Puetz et al. (Solar Energy Materials, 2011, 579) disclose unmodified, Indium doped Zinc oxide nanoparticle suspension and its use between an active layer and a silver electrode.

Until now, no metal oxide buffer layers (particularly no ZnO or AZO ETL layers) for organic electronics are known which are present between an active organic layer and a silver electrode ("inverted architecture") meeting industrial demands. The reason for this is that either the coating liquid is damaging the active layer (see above, Stubhan et al) or is forming an insufficient contact with the silver electrode (see above, Yip et al).

SUMMARY

Thus, it is an object of the present invention to mitigate at least some of these drawbacks of the state of the art. In particular, it is an aim of the present invention to provide compositions suitable for thin film formation on a plurality of substrates. It is a further aim to provide manufacturing methods for thin films avoiding vapor phase processes and to provide improved electrical devices and electronic device component.

These objectives are achieved by a device selected from the group of organic electronics, said device including a substrate and a multitude of layers, wherein at least one of said layers is a buffer layer, wherein said buffer layer includes metal oxide nanoparticles coated with at least one dispersant, wherein said dispersant is a phosphate ester of alkyl ethers of formula (I)

wherein R is $C_1$-$C_{10}$-alkyl; and m and n are each, independently, 2 to 60;

or wherein said dispersant is a phosphate ester of block copolymers of formula (III)

wherein R is $C_{1-10}$-alkyl; PES is a polyester derived from a cyclic lactone; o is from 5 to 60; p is from 2 to 30; and where the molecular weight of $RO(C_2H_4O)_o$ is greater than the molecular weight of $(PES)_p$.

The objectives are also achieved by an electronic device component including a sheet-like substrate coated with a multitude of layers, wherein said layers
(a) have the sequence electrode/HEL/active layer/EEL/electrode ("normal architecture"); or
(b) have the sequence electrode/EEL/active layer/HEL/electrode. ("inverted architecture"); or
(c) include the sequence electrode/EEL/active layer/HEL; or
(d) include the sequence electrode/HEL/active layer/EEL; or
(e) include the sequence electrode/HIL/HTL/active layer/ETL/EIL/Electrode,
wherein in each case (a) to (e) one or more of the buffer layers, HEL, EEL, HIL, as the case may be, contains metal oxide nanoparticles selected from the group consisting of ZnO, Al-doped ZnO ("AZO"), ZnO containing carbonaceous material, AZO containing carbonaceous material, TiOx and doped TiOx.

Further aspects of the invention are disclosed in the specification and independent claims, preferred embodiments are disclosed in the specification and the dependent claims.

DETAILED DESCRIPTION

The present invention will be described in detail below. It is understood that the various embodiments, preferences and ranges as provided/disclosed in this specification may be combined at will. Further, depending of the specific embodiment, selected definitions, embodiments or ranges may not apply.

Unless otherwise stated, the following definitions shall apply in this specification:

The terms "a", "an," "the" and similar terms used in the context of the present invention are to be construed to cover both the singular and plural unless otherwise indicated herein or clearly contradicted by the context. Further, the terms "including", "containing" and "comprising" are used herein in their open, non-limiting sense. The term "containing" shall include both, "comprising" and "consisting of".

Percentages are given as weight-%, unless otherwise indicated herein or clearly contradicted by the context.

The term "electronic device" is known in the field. In the context of the present invention, any device comprising functional thin films is encompassed, including inorganic LEDs, inorganic solar cells or inorganic transistors; but specifically organic electronics as defined below.

The terms "organic electronics", "organic electronic devices", "OLED", "OPV" are known in the field and relate to electronic devices comprising a substrate and a multitude of layers, wherein at least one layer is a buffer layer as defined below. Depending on the remaining layers, its structure and connection, these devices serve a multitude of purposes, such as an OLED, an OPV cell, organic photo detector or an organic transistor.

The term LED comprises both, organic LEDs (OLEDs) where the active layer comprises organic electroluminescent materials (polymers or small molecule), and Quantum dot LEDs (QLEDs), where the active layer comprises electroluminescent quantum dots.

The term "Buffer layer" denotes an interface layer in electronic devices, typically in OPV or OLED devices. Buffer layer is the general term for layers with a charge selective function such as hole transport (HTL), hole injection (HIL), hole extraction (HEL), electron transport (ETL), electron injection (EIL) or electron extraction (EEL). In the context of the present invention the term buffer layer is generally representing the different specific functions. A buffer layer is often also referred as charge selective layer or charge transport layer (CTL). Accordingly, the term buffer layer includes both, electron selective layers and hole selective layers.

The term "Scattering Particles" is known and describes materials that efficiently scatter light. Typically, scattering particles exhibit a high refractive index (such as >2.0, preferably >2.3) and a particle size in the range of the wavelength of visible light (such as 100-1000 nm, preferably 200-500 nm).

The term "Haze" is known; the haze of a thin film is physically defined as the intensity of the diffuse transmission divided by the total transmission through the thin film. Haze can be measured with an integrated sphere.

The term "active layer" denotes a layer which is photo-active and either converts light into electrical energy (light absorbing; e.g. solar cells) or converts electrical energy into light (light emitting; e.g. LED's). In the context of the present invention, active layers contain one or more active materials.

In a specific embodiment, the active layer of a solar cell comprises a fullerene-based compound such as PCBM (acceptor) and a second active material (donor).

In a further specific embodiment, the active layer of a LED comprises organic materials, such as polymers or small molecules, such as discussed in Geffroy et al (Polym Int. 55:572-582 (2006)).

In a further specific embodiment, the active layer of a LED comprises electroluminescent quantum dots, such as Perovskite type crystals as disclosed e.g. in Kovalenko et al (Nanoletters 2014, DOI: 10.1021/nl5048779).

The term "active material" denotes materials which are photoactive and either have electron acceptor or electron donor properties. This includes photoactive polymers, photoactive small molecules, photoactive quantum dots, photoactive metal-organic perovskites as used herein.

The terms "Perovskite" and "Perovskite-type materials" are known in the field and generally relate to crystalline materials complying with structure XIIAVIBX3. Perovskite-type materials for example include metal organic halide materials such as methyl-ammonium-lead-iodide (CH3NH3PbI3) or methyl-ammonium-tin-iodide (CH3NH3SnI3).

The term "nanoparticle" is known and particularly relates to solid amorphous or crystalline particles having at least one dimension in the size range of 1-100 nm. Preferably, nanoparticles are approximately isometric (such as spherical or cubic nanoparticles). Particles are considered approximately isometric, in case the aspect ratio (longest:shortest direction) of all 3 orthogonal dimensions is 1-2. In an advantageous embodiment, the nanoparticles have a mean primary particle size of 2-60 nm, preferably 5-30 nm (measured by transmission electron microscopy).

The term "nanoparticle layer" denotes a film composed of nanoparticles. The thickness of the nanoparticle layer may vary over a broad range, but typically is 3-1000 nm, preferably 10-300 nm. If no scattering particles are present, the range is typically 3-1 000 nm, such as 3-30 nm for self-assembling monolayers. If scattering particles are present, the range is typically 100-20 000 nm preferably 1 000-10 000 nm. A nanoparticle layer can be composed of a monolayer of nanoparticles, thus having a thickness equal to the size of the used nanoparticles and thus defining a lower limit of the thickness. A nanoparticle layer can be composed of nanoparticles with a single size or with a bimodal or multimodal size distribution. Bimodal or multimodal size distributions are believed to result in a higher packing density of the nanoparticle layer. Further, the volume porosity of a nanoparticle layer typically is less than 95%, preferably less than 70%.

The term "Metal oxide nanoparticles" includes (i) nanoparticles of pure oxides, (ii) nanoparticles of doped oxides, (iii) mixed metal oxides and (iv) core shell nanoparticles, whereby the core and shell are composed of different oxides.

The term "AZO" is known in the field and includes Aluminum doped Zinc oxides meaning that the Aluminum is atomically dispersed in the Zinc oxide lattice (solid solution).

The term "SAM" is known in the field and denotes a self assembled monolayer. Self-assembled monolayers of organic molecules are molecular assemblies formed spontaneously on surfaces by adsorption and are organized into more or less large ordered domains.

The term "organic solvent" is known in the field and particularly includes alcohols, glycol ethers, nitriles, ketones, esters, ethers, aldehydes and aliphatic solvents. The above organics can be substituted or unsubstituted and include linear, branched and cyclic derivatives. There can also be unsaturated bonds in the molecule. The above derivatives typically have 1-12 carbon atoms, preferably 1-7 carbon atoms.

The terms "surfactant", "dispersant" and "dispersing agent" are known in the field and have essentially the same meaning. In the context of the present invention, these terms denote an organic substance, other than a solvent, which is used in suspensions or colloids to improve the separation of particles and to prevent agglomeration or settling. Surfactants, dispersants and dispersing agents can be polymers or small molecules and typically contain functional groups. Surfactants, dispersants and dispersing agents are physically or chemically attached on the particle surface either before or after adding the particles to the external phase. In the context of the present invention, water and organic solvent molecules (e.g. ethanol, methanol or isopropanol) are not considered surfactants, dispersants or dispersing agents.

The term "suspension" is known and relates to a heterogeneous fluid of an internal phase (i.p.) that is a solid and an external phase (e.p.) that is a liquid. In the context of the present invention, a suspension typically has a kinetic stability of at least 1 day (measured according to complete particle sedimentation). In an advantageous embodiment, the invention provides for a composition with (hydrodynamic size D90 of less than 100 nm) a shelf-life of more than 7 days, particularly more than 2 months. The external phase typically comprises one or more solvents, such as water, alcohols and ketones and the like.

The term "solution-processing" is known in the field and denotes the application of a coating or thin film to a substrate by the use of a solution-based (=liquid) starting material. In the context of the present invention, solution processing relates to the fabrication of organic electronics and electronic device component comprising thin nanoparticle films by the use of one or more liquid suspensions; typically the application of the suspension(s) is/are conducted at ambient pressure.

The present invention will be better understood by reference to the figures.

Figure 1:
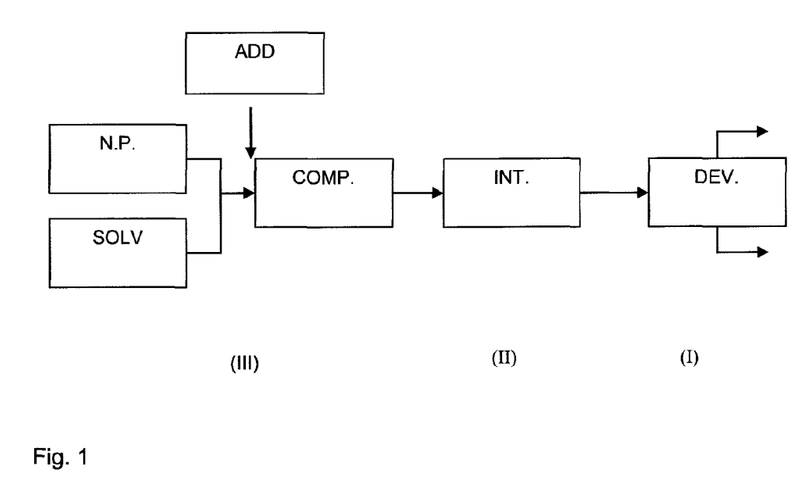
FIG. 1 is a schematic diagram of the process of making an electronic device component (INT) and an electronic device (DEV) in accordance with the present invention using a composition (COMP) in accordance with the present invention.

FIG. 1 outlines the various aspects of the present invention. In summary, the invention describes electronic devices from the group of organic electronics (DEV; 1st aspect of the invention) having specific buffer layer(s); electronic device component (INT, 2nd aspect) suitable for manufacturing the above organic electronics; compositions in the form of a suspension (COMP, 3rd aspect) suitable for manufacturing the above electronic device component by wet phase processing. These compositions may be obtained by combining known starting materials, such as MOx nanoparticles (N.P.), phosphate esters (ADD) and solvents (SOLV).

Figure 2:
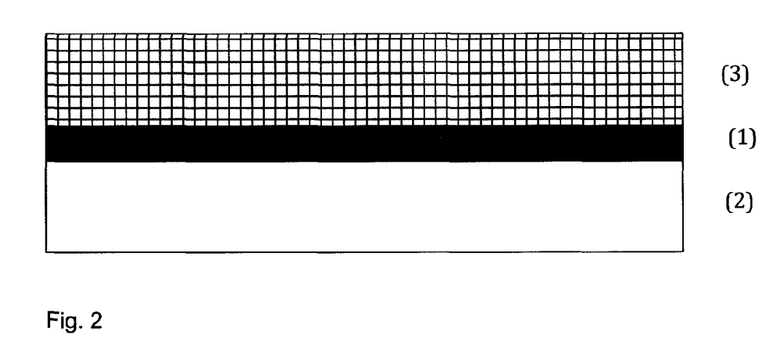
FIG. 2 is a schematic side view of an exemplary electronic device component the includes a first buffer layer, an active layer and a second buffer layer in accordance with the present invention.

FIG. 2 shows the essential layers of an electronic device component (INT), useful for the manufacturing of organic electronics, wherein (3) is a buffer layer as described herein, (1) is an active layer (including e.g. a polymer, a small-molecule or a perovskite active material) and (2) is a second buffer layer (with opposite polarization compared to the first buffer layer). The second buffer layer can either have a composition according to the present invention or to a different material (e.g. state-of-the art material). Typically, the three depicted layers are only part of a more complex layer architecture forming an electronic device component; underneath or on top of the depicted layers can be an electrode which can be transparent or non-transparent or can be additional buffer layers (either according to the present invention or not).

Figure 3:
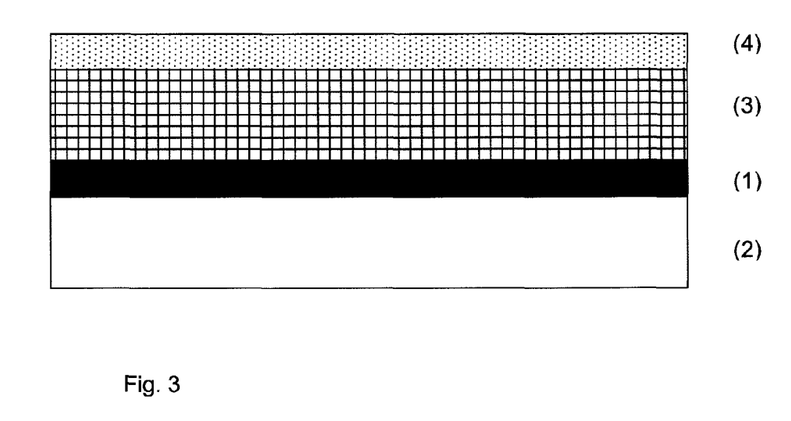
FIG. 3. Is a schematic side view of an exemplary electronic device including a nanoparticle composition layer and an electrode in accordance with the present invention.

FIG. 3 shows a schematic illustration for an inventive nanoparticle layer composition comprising (3) ZnO or AZO as the electron selective layer. An Ag electrode (4) directly attached to the ETL layer. No SAM layer is present between the Ag electrode and the electron selective layer.

In a first aspect, the invention relates to an electronic device selected from the group of organic electronics, wherein said device comprises a substrate and a multitude of layers, wherein at least of said layers is a buffer layer, wherein said buffer layer comprises metal oxide nanoparticles coated with a dispersant as described herein.

In more general terms, the invention relates to buffer layers in an electronic device such as OPV or OLED, said buffer layers having a specific and beneficial composition containing a metal oxide as described below and dispersant(s) as described below. It was found that the present inventive ETL compositions show beneficial properties because: (i) no post-treatment (e.g. plasma cleaning or annealing temperatures >150° C.) is required to achieve good device performance and (ii) such buffer layers are directly compatible with vacuum deposited Ag electrodes without the need of an additional SAM layer.

This aspect of the invention shall be explained in further detail below.

The terms electronic devices and organic electronics are defined above.

In one embodiment, the device is selected from the group of organic solar cells (OPV), organic light emitting diodes (OLED), organic photodetectors, organic transistors, quantum dot LEDs (QLEDs); particularly OPV and OLED, very particularly OPV.

In one embodiment, the multitude of layers of the device is arranged in normal architecture. Accordingly, the invention relates to an OPV or OLED device where the electron transport layer is applied between a silver electrode and an organic active layer. The invention also relates to an OPV or OLED device where the electron transport layer is applied between a silver electrode and a Perovskite-type active material.

In one embodiment, the multitude of layers of the device is arranged in inverted architecture.

In a further embodiment, the invention relates to an OPV device with tandem architecture.

In a further embodiment, the invention relates to an OPV device with tandem architecture whereby an inventive layer of the present invention is part of the recombination layer.

In one embodiment, the buffer layer is selected from the group consisting of hole transport (HTL), hole injection (HIL), hole extraction (HEL), electron transport (ETL), electron injection (EIL) and electron extraction (EEL) layers, preferably ETL, EIL and EEL.

In one embodiment, the substrate is selected from hydrophobic or hydrophilic organic materials, preferably PEDOT:PSS, photoactive polymers (absorbers or emitters) or photoactive small molecules (absorbers or emitters). Generally, suitable materials possess a surface free energy below 40 mJ/m2.

In one further embodiment, the substrate is selected from a hydrophilic inorganic material, preferably ITO or silver (including a vacuum deposited dense Ag layer or a solution processed porous Ag nanowire layer).

In one embodiment, the top electrode of the device is a silver, a copper or a nickel electrode, particularly a Ag-, Cu- or Ni-nano wire electrode. The nano wires of such electrodes can be embedded in the hydrophilic or hydrophobic organic materials as defined above, particularly in PEDOT:PSS.

In one embodiment, the top and bottom electrodes are both made from metal nanowires. This embodiment provides transparent or semitransparent electronic devices. The nano wires of such electrodes can be embedded in the hydrophilic or hydrophobic organic materials as defined above, particularly in PEDOT:PSS.

In one embodiment, the top and/or bottom electrode is pure PEDOT:PSS.

In one further embodiment, the top and/or bottom electrode is a combination of PEDOT:PSS with a regular metal collector grid (such as an Ag-, Cu- or Ni-collector grid).

Metal oxide nanoparticles: The term metal oxide nanoparticles is defined above.

In one embodiment, the nanoparticles are selected from the group consisting of pure metal oxides, preferably ZnO, TiOx, WOx, VyOx, MoyOx, NiO, and NbyOx. A particularly preferred pure metal oxide is ZnO. A further particularly preferred pure metal oxide is TiOx.

In one embodiment, the nanoparticles are selected from the group consisting of mixed metal oxides, preferably zinc containing mixed metal oxides, most preferably indium gallium zinc oxide (IGZO), indium zinc oxide (IZO), zinc tin oxide (ZnSnO3).

In one embodiment, the nanoparticles are selected from the group consisting of doped metal oxides, particularly doped ZnO, TiOx, WOx, VyOx, MoyOx, NiO, NbyOx, InyOx and SnOx, most preferably ZnO, TiOx, InyOx and SnOx. Suitable dopants and amounts of dopants are known in the field. The term doped metal oxide relates to compositions of MOx where Metal (M) is substituted by one or more metals (="dopants"). The dopant atoms are incorporated into the MYOx crystal lattice either substitutionally or interstitially forming a homogeneous single-phase (a "solid solution"). Specific examples include ITO (indium tin oxide; typical 90% In2O3: 10% SnO2) and ATO (antimony doped tin oxide; typical 90% SnO2: 10% Sb2O3). In the context of the present invention, separated multiphase systems (e.g. MOx+Fe2O3) are not considered doped oxides. Doping of oxides can enable the fine tuning of the properties of the inventive thin films, such as electrical conductivity, work function and/or optical absorbance.

In a preferred embodiment said metal oxides are doped with 0.001-30 wt %, preferably 0.01-15 wt %, most preferably 0.1-10 wt % (with respect to the metal), by one or more metals.

In a preferred embodiment, said dopant atoms are selected from the group consisting of transition metals, alkaline metals and earth-alkaline metals.

In one embodiment, the nanoparticles (particularly pure metal oxides, doped metal oxides) additionally contain carbonaceous material. The amount of carbonaceous material may be in the range of 0.2-4 wt %. The carbonaceous material may be present in sp2 and/or sp3 hybridization, saturated with hydrogen at the terminal positions. The carbonaceous material may form a separate phase within the metal oxide nanoparticle, e.g. by forming a core or by forming dotted areas. Such materials are known and described e.g. in Leidolph et al, cited above.

In one embodiment, the nanoparticles are selected from ZnO, Al-doped ZnO ("AZO"), ZnO containing carbonaceous material, AZO containing carbonaceous material.

In one further embodiment, the nanoparticles are a mixture of two or more types of nanoparticles. Suitable mixtures include a combination of (i) ZnO nanoparticles with WOx nanoparticles and (ii) AZO nanoparticles with WOx nanoparticles. Such combinations may cover a broad range, for example 1/10 to 10/1, preferably 1/1. Such combination of nanoparticles may help to fine-tune optical or electrical properties of the inventive buffer layer.

Dispersants: According to the present invention, dispersants are phosphate esters of alkyl ethers of formula (I) or of block copolymers of formula (III), as described below. It is generally accepted that such phosphate esters form complex mixtures of mono-esters and di-esters, free phosphate typically being present as well. Further, phosphates and pyrophosphates being present. This complex mixture of compounds being termed either phosphate esters of alkyl ethers of formula (I) or phosphate esters of block copolymers of formula (III), as the case may be.

In one embodiment, the phosphate ester is a phosphate ester of an alkyl ether of formula (I)

$$\text{RO} - (\text{C}_2\text{H}_4\text{O})_m (\text{C}_3\text{H}_6\text{O})_n - \text{H} \tag{I}$$

wherein R is C1-C10-alkyl; and m and n are each, independently, 2 to 20. Accordingly, the alkyl ethers of formula (I) belong to the class of poly(C2-3-alkylene glycol)-mono-C1-10-alkyl ethers.

R may be linear or branched, but is preferably linear. R is especially methyl.

Preferably, m is not less than 2 and especially not less than 3. It is also preferred that m is not greater than 20, more preferably not greater than 10 and especially not greater than 5.

Preferably, n is not less than 3, more preferably not less than 5 and especially not less than 7. It is also preferred that n is not greater than 40, more preferably not greater than 20 and especially not greater than 10.

The ratio of m/n is preferably between 1/1 and 1/10 and especially between 1/2 and 1/5.

The molecular weight of the mono alkyl ether of formula (I) is preferably less than 6,000, more preferably less than 3,000, even more preferably less than 2,000 and especially less than 1,000. It is also preferred that the molecular weight of the alkyl ether of formula (I) is not less than 200, more preferably not less than 400 and especially not less than 600.

The phosphate esters of alkyl ethers (I) as described herein may comprise the following compounds:

wherein the substituents are as defined hereinbefore. Typically, the first identified compound is the main compound of the composition, forming 50 wt % or more of the composition.

The phosphate esters of alkyl ethers (I) as described herein contain free OH groups. It is known that such groups are reactive and are particularly susceptible towards salt formation or ester formation. For example, when contacted with the metal oxide nanoparticles, salts such as Zinc phosphates or Aluminum phosphates may be formed. Further, when contacted with solvents, such as alcohols, phosphate esters may be formed. Such salts and esters of the above phosphate esters of alkyl ethers (I) are encompassed.

The phosphate esters of alkyl ethers (I) as described herein are commercial items. Such phosphate ester may be made by any method known in the art, and is preferably made by reacting the alkyl ether of formula (I) with a phosphating agent. Preferred phosphating agents are H3PO4 POCl3, polyphosphoric acid and especially P2O5.

According to the invention, the phosphate ester may be in the form of a free acid or it may form a salt with an alkali metal, ammonia, an amine, alkanolamine or a quaternary ammonium cation. Preferably, the alkali metal is lithium, potassium and especially sodium.

According to the invention, the phosphate ester may also be further reacted with an alkanol or alkanolamine. Preferred alkanols are C1-6- and especially C1-4-alkanols. When the phosphate ester is further reacted with the alkanol additional ester groups are formed and the ratio of the monoalkyl ether of formula 1 to the phosphorus atom of the phosphating agent is less than 2 and especially less than 1.5. When the phosphate ester is reacted with an alkanolamine, the alkanolamine may form ester and/or amido groups and/or amine salts. It is believed that the reaction product is mainly an amine salt. Examples of alkanolamines are ethanolamine, diethanolamine, 2-dimethylamino ethanol and 2-amino-2-methyl-1-propanol.

The alkyl ether of formula (I) is made by any method known in the art and is preferably made by reacting a polyethyleneglycol alkyl ether of formula (II)

wherein R and m are as defined hereinbefore with propylene oxide.

The alkyl ether of formula (II) is a commercial item. Typically, the alkyl ether of formula (II) is reacted with propylene oxide in an inert atmosphere such as nitrogen and under anhydrous conditions in the presence of an alkali metal. The alkali metal is preferably lithium, sodium and especially potassium. The alkali metal is conveniently added to the alkyl ether of formula (II) as a water soluble inorganic salt, especially a hydroxide and the water removed by heating, especially heating under reduced pressure prior to adding the propylene oxide. Owing to the volatility of propylene oxide, its reaction with the alkyl ether of formula (II) is carried out in a closed vessel, generally at temperatures between 40 and 140° C. Preferably, the temperature is above 80 and especially above 100° C.

The reaction between the alkyl ether of formula (I) and the phosphating agent is also preferably carried out in an inert atmosphere such as nitrogen under anhydrous conditions. The reaction may be carried out in an inert solvent but is more convenient to react the alkyl ether with the phosphating agent in the absence of a solvent. The reaction temperature is preferably above 60 and especially above 80° C. In order to avoid charring of the dispersant, the temperature is preferably less than 120 and especially less than 100° C.

When the phosphate ester contains additional ester, amide and/or amine salt groups formed by reacting the phosphate ester with an alkanol or alkanolamine, the alkanol or alkanolamine may be reacted with the phosphate ester under the same conditions as are used for reacting the alkyl ether with the phosphating agent.

In one further embodiment, the phosphate ester is a phosphate ester of a block copolymer of formula (III)

wherein R is C1-10-alkyl; PES is a polyester derived from a cyclic lactone; o is from 5 to 60; p is from 2 to 30; and where the molecular weight of RO(C2H4O)o is greater than the molecular weight of (PES)p. Accordingly, the alkyl ethers of formula (III) ("block copolymers") belong to the class of poly(C2-alkylene glycol-C5-6ester)-mono-C1-10-alkyl ethers.

R may be linear or branched but is preferably linear. R is especially methyl.

The cyclic lactone is preferably valerolactone and especially s-caprolactone. When PES represents a polyester derived from valerolactone, the repeat unit is of formula —O—(CH2)4CO— or —O—CH(CH3)-(CH2)2CO—;

when PES represents a polyester derived from E-caprolactone, the repeat unit is of formula —O—(CH2)5CO—.

Preferably, o is not greater than 40 and especially not greater than 25. Preferably, p is not greater than 20 and especially not greater than 10. Preferably the ratio of o:p is not less than 3:1, more preferably not less than 4:1 and especially not less than 6:1.

The MW of the block copolymer of formula (III) is preferably less than 5,000, more preferably less than 4,000, even more preferably less than 3,500 and especially less than 3,000.

The phosphate esters of block copolymers (III) as described herein are commercial items. Such phosphate ester may be made by any method known in the art, and is preferably made by reacting the alkyl ether of formula (III) with a phosphating agent wherein the ratio of monoalkyl ether to each phosphorus atom of the phosphating agent is from 3:1 to 1:1 and especially from 2:1 to 1:1.

It is especially preferred that the ratio of alkyl ether (III) to each phosphorus atom of the phosphating agent is less than 2, for example, about 1.5:1 when the dispersant is a mixture of mono- and di-phosphate esters. Preferred phosphating agents are phosphoric acid, POCl3, P2O5 and especially polyphosphoric acid.

According to the invention, the phosphate ester may be in the form of a free acid or it may form a salt with an alkali metal, ammonia, an amine, alkanolamine or a quaternary ammonium cation. Preferably, the alkali metal is lithium, potassium and especially sodium.

According to the invention, the phosphate ester may also be further reacted with an alkanol or alkanolamine. Preferred alkanols are C1-6 and especially C1-4-alkanols. When the phosphate ester is further reacted with the alkanol, additional ester groups are formed and the ratio of the monoalkyl ether of formula (III) to the phosphorus atom of the phosphating agent is less than 2 and especially less than 1.5. When the phosphate ester is reacted with an alkanolamine, the alkanolamine may form ester and/or amido groups and/or amine salts. It is believed that the reaction product is mainly an amine salt. Examples of alkanolamines are ethanolamine, diethanolamine, 2-dimethylamino ethanol and 2-amino-2-methyl-1-propanol.

The phosphate ester of a block copolymer of formula (III) as described herein may comprise the following compounds wherein the substituents are as defined hereinbefore. Typically, the first identified compound is the main compound of the composition, forming 50 wt % or more of the composition.

The phosphate ester of a block copolymer of formula (III) as described herein contain free OH groups. It is known that such groups are reactive and are particularly susceptible towards salt formation or ester formation. For example, when contacted with the above metal oxide nanoparticles, salts such as Zinc phosphates or Aluminum phosphates may be formed. Further, when contacted with solvents, such as alcohols, phosphate esters may be formed. Such salts and esters of the above phosphate ester of a block copolymer of formula (III) are encompassed.

The block copolymer of formula (III) is made by any method known in the art and is preferably made by reacting a polyethyleneglycol alkylether of formula (IV)

$$R0\text{-}(C2H40)o\text{-}H \qquad (IV),$$

wherein R and o are as defined hereinbefore, with a cyclic lactone such as valerolactone or epsilon-caprolactone.

The alkyl ether of formula (IV) is a commercial item. Typically, the reaction is carried out in an inert atmosphere such as nitrogen under anhydrous conditions and is also preferably catalyzed by a metal salt which is soluble in the reaction mass. A preferred catalyst is a titanium salt, particularly an alkoxide such as titanium tetra n-butylate. The reaction is preferably carried out at temperatures above 100° C. and preferably above 150° C. In order to avoid charring of the copolymer the temperature is preferably less than 220° C. and especially less than 200° C.

The reaction between the alkyl ether of formula (III) and the phosphating agent is also preferably carried out in an inert atmosphere such as nitrogen under anhydrous conditions. The reaction may be carried out in an inert solvent but it is more convenient to react the alkyl ether with the phosphating agent in the absence of a solvent. The reaction temperature is preferably above 60 and especially above 80° C. In order to avoid charring of the dispersant, the temperature is preferably less than 120 and especially less than 100° C.

It is particularly preferred that the block copolymer is not isolated but is directly converted to the phosphate ester by reaction with a phosphating agent. The here preferred phosphating agent is polyphosphoric acid.

When the dispersant contains additional ester, amide and/or amine salt groups formed by reacting the phosphate ester with an alkanol or alkanolamine the alkanol or alkanolamine may be reacted with the phosphate ester under the same conditions as are used for reacting the monoalkyl ether with the phosphating agent.

Coating: Without being bound to theory, it is believed that the passivation of the nanoparticle oxide surface by phosphate functionalities has a beneficial effect on the electronic properties of corresponding buffer layers. As used herein, the term coating includes (i) direct chemical bonding (e.g. a covalent bond) between the metal oxides as defined herein and the dispersant as defined herein and (ii) adsorption of the dispersant on the surface of the metal oxides (e.g. physisorption). An equilibrium between chemical bonding/adsorption and free components may exist, depending on the metal oxide and the dispersant.

In one embodiment, the invention provides a buffer layer with a composition as described herein wherein said layer consists of metal oxide nanoparticles and a dispersant as described herein.

In one embodiment, said metal oxide nanoparticles are coated with one type of dispersant as defined herein.

In one alternative embodiment, said metal oxide nanoparticles are coated with two or more types of dispersant as defined herein. In this embodiment, either an individual nanoparticle is coated with said two or more types of dispersant or a first group on nanoparticles is coated with a first dispersant, a second group of nanoparticles is coated with a second dispersant and so on.

In a further embodiment, the invention provides a buffer layer with the following composition: 70-99 wt % Metal oxide and 0.005-13 wt % Phosphorus, preferably 0.03-4.8 wt % Phosphorus, most preferably 0.1-2 wt % Phosphorus.

The layers described herein have beneficial properties and have advantageous uses as outlined below. It was found that the inventive layers show good device performance in a device architecture where an Ag electrode is in direct contact with an inventive ETL layer.

In an advantageous embodiment, the invention provides a buffer layer as described herein containing 70-99 wt %, preferably 85-98 wt % ZnO nanoparticles and 1-30 wt %, preferably 2-15 wt % dispersant.

In an advantageous embodiment, the invention provides a buffer layer as described herein containing 70-99 wt %, preferably 85-98 wt % AZO nanoparticles and 1-30 wt %, preferably 2-15 wt % dispersant.

In an advantageous embodiment, the invention provides a buffer layer as described herein containing 70-99 wt %, preferably 85-98 wt % TiOx nanoparticles and 1-30 wt %, preferably 2-15 wt % dispersant.

In a further embodiment, the invention provides an electronic device as described herein wherein said buffer layers have a film thickness of 3-1000 nm, preferably 10-500 nm. In one embodiment, monolayers, typically 3-30 nm thick are also envisaged. Thickness may be determined by profilometry, atomic force microscopy or electron microscopy.

In a further embodiment, the invention provides an electronic device as described herein wherein said oxide nanoparticles have a primary particle diameter of 1-200 nm, preferably 3-50 nm (measured by nitrogen absorption, X-Ray diffraction or transmission electron microscopy).

In a further embodiment, the invention provides an electronic device as described herein wherein said oxide nanoparticles exhibit a bimodal or multimodal size distribution. It is believed that bimodal or multimodal size distributions result in higher particle packing densities, thus resulting in lower layer porosity.

In a further embodiment, the invention provides an electronic device as described herein wherein said buffer layers have a mean surface roughness below 100 nm, especially below 30 nm (determined by electron microscopy, atomic force microscopy or profilometry).

In a further embodiment, the invention provides an electronic device as described herein wherein said buffer layer comprises, in addition to the nanoparticles as described herein, scattering particles. Accordingly, buffer layers of the present invention may additionally comprise scattering particles, typically having a refractive index of >2.3 and being comparatively large, typically with a particle size of 100-500 nm. The presence of such scattering particles provides for controlled Haze to an electronically functional buffer layer. The use of such buffer layers with light scattering properties (Haze) is for light extraction (light outcoupling) in OLED devices or for light incoupling in Solar cells, which enhances the efficiency of either device (more light gets into solar cell or more light is extracted from an OLED). Typical compositions of scattering particles are $BaTiO_3$, $SrTiO_3$, $TiO_2$.

Typical concentrations of scattering particles in the dry buffer layer range from 10-70 wt %.

In a further embodiment, the invention provides an electronic device as described herein wherein said buffer layer has an electrical conductivity of 10-8-103 S/cm, preferably 10-6-102, most preferably 10-3-10 (determined by 4-point conductivity measurement).

In a more specific embodiment, the invention provides an electronic device as described herein wherein said buffer layer comprises scattering particles and has an electrical conductivity of 10-1-103 S/cm.

In a further embodiment, the invention relates to an OLED wherein the ETL (i) is obtained by a method as described herein or (ii) consists of metal oxide nanoparticles coated with a dispersant as described herein.

In a further embodiment, the invention relates to an OLED wherein the device stack comprises the sequence electrode/HIL/HTL/active layer/ETL/EIL/electrode.

In a further embodiment, the invention relates to an OLED wherein the ETL layer consists of a monolayer of nanoparticles coated with a dispersant as described herein.

In a further embodiment, the invention relates to an organic solar cell (OPV) wherein the ETL (i) is obtained by a method as described herein or (ii) consists of metal oxide nanoparticles coated with a dispersant as described herein. In this embodiment, the OPV preferably comprises a substrate selected from the group of organic polymers, metals or oxides.

In a further embodiment, the invention relates to an organic photodetector wherein the ETL (i) is obtained by a method as described herein or (ii) consists of metal oxide nanoparticles coated with a dispersant as described herein.

In a further embodiment, the invention relates to an organic transistor wherein the device stack comprises the sequence electrode/ETL/active layer/ . . . .

In a further embodiment, the invention relates to an electronic device wherein the ETL (i) is obtained by a method as described herein or (ii) consists of metal oxide nanoparticles coated with at least one type of a dispersant as described herein.

In a second aspect, the invention relates to an electronic device component comprising a sheet-like substrate coated with a multitude of layers.

This aspect of the invention shall be explained in further detail below.

Electronic device component: As outlined above, there is a need for manufacturing organic electronics by solution based processes. Accordingly, an electronic device component is manufactured by suitable solution based processes, such as coating or printing; the thus obtained material is then finished to obtain the final device (the organic electronic).

In one embodiment, the invention provides an electronic device component as defined herein, wherein said layers have the sequence electrode/HEL/active layer/EEL/electrode. ("normal architecture").

In one further embodiment, the invention provides an electronic device component as defined herein, wherein said layers have the sequence electrode/EEL/active layer/HEL/electrode. ("inverted architecture").

In one further embodiment, the invention provides an electronic device component as defined herein, wherein said layers comprise the sequence electrode/EEL/active layer/HEL. This component may also be the basis of a tandem cell.

In one further embodiment, the invention provides an electronic device component as defined herein, wherein said layers comprise the sequence electrode/HEL/active layer/ EEL. This component may also be the basis of a tandem cell.

In one further embodiment, the invention provides an electronic device component as defined herein, wherein said layers have the sequences:
(a) Transparent electrode/HEL/active layer/EEL
(b) Non-transparent electrode/HEL/active layer/EEL
(c) Transparent electrode/EEL/active layer/HEL
(d) Non-transparent electrode/EEL/active layer/HEL,
whereby the transparent electrode is selected from the group consisting of: PEDOT:PSS, Metal nanowires (including Silver nanowires, Copper nanowires, Nickel nanowires), Graphene, Carbon nanotubes and ITO; and
whereby the non-transparent electrode is selected from the group consisting of dense silver, dense aluminum, dense copper, dense gold, thick (opaque) carbon nanotube layer and thick (opaque) graphene-based layer.

In one further embodiment, the invention provides an electronic device component as defined herein, wherein no additional layer is present.

In one further embodiment, the invention provides an electronic device component as defined herein, wherein the buffer layer has a thickness between 3-1000 nm, preferably 10-500 nm.

In one further embodiment, the invention provides an electronic device component as defined herein, wherein the buffer layer has a mean surface roughness below 30 nm.

In one further embodiment, the invention provides an electronic device component as defined herein, the substrate is as defined in the first aspect of the invention.

In one further embodiment, the invention provides an electronic device component as defined herein, wherein the P content of the buffer layer is in the range of 0.005-13 wt %, preferably 0.03-4.8 wt %, most preferably 0.1-2 wt %.

In a third aspect, the invention relates to a composition in the form of a suspension, said composition containing metal oxide nanoparticles, solvent(s) and a dispersant as described herein. This aspect of the invention shall be explained in further detail below.

The term suspension is defined above. The use of such suspensions for manufacturing thin films, such as buffer layers, is novel and subject of the present invention.

Accordingly, the invention provides for the use of metal oxide nanoparticles coated with a dispersant as described herein for manufacturing of an electronic device component as defined herein. The invention further provides for the use of metal oxide nanoparticles coated with a dispersant as described herein for manufacturing an electronic device as described herein, particularly selected from the group of OLEDs, OPVs, photodetectors and organic transistors.

Further, the invention provides for the use of a suspension, comprising metal oxide nanoparticles coated with a dispersant as described herein and a solvent (preferably selected from the group consisting of water, alcohols, glycol ethers and ketones), for manufacturing of an electronic device component as defined herein or for manufacturing an electronic device as described herein (particularly selected from the group of OLEDs, OPVs, photodetectors and organic transistors.

In a further embodiment, the solvent is selected from the group of fluorinated and chlorinated solvents, preferably fluorinated and chlorinated alcohols, such as tetrafluoropropanol.

Further, certain of the above defined suspensions are novel and thus subject of the present invention. Accordingly, the invention provides for a composition in the form of a suspension comprising (i) nanoparticles selected from the group of metal oxide nanoparticles but excluding ZnO nanoparticles, and (ii) one or more solvents and (iii) one or more dispersants as described herein In a further advantageous embodiment, the nanoparticles in suspension have a hydrodynamic size D90 of less than 100 nm (measured by dynamic light scattering or centrifugal sedimentation techniques).

In a further advantageous embodiment, the nanoparticles are synthesized by a gas phase pyrolysis process, preferably flame spray synthesis.

The amount of nanoparticles in the inventive composition may—depending on the intended use—vary over a broad range, but typically is in the range of 0.1-60 wt % (preferably 0.5-40 wt %) of the composition.

In a forth aspect, the invention relates to the manufacturing of the inventive compositions, electronic device component and devices disclosed herein and to inventive compositions, electronic device component and devices obtained according to these methods. This aspect of the invention shall be explained in further detail below.

Manufacturing of suspensions: The manufacturing of suspensions is a known procedure. The coating of nanoparticles is also a known procedure. These procedures may be applied to the starting materials of the inventive suspensions.

In one embodiment, solvent and nanoparticles are combined, for example by mixing or ball milling. To the obtained initial suspension, the dispersants are added. Coating takes place at room temperature or upon heating and mixing.

In one alternative embodiment, solvent and dispersants are combined, for example by mixing. To the obtained initial solution, the nanoparticles are added. Coating takes place at room temperature or upon heating and mixing.

Manufacturing of electronic device component: The electronic device component according to the present invention may by obtained by solution processes. This is considered a significant advantage, as it enables manufacturing of all layers by simple technologies applicable to large areas and continuous processing.

In one embodiment, the invention provides for a method for manufacturing an electronic device component as defined herein, wherein the buffer layer is manufactured comprising the steps of (a) applying a suspension on a substrate or coated substrate, said suspension comprising metal oxide nanoparticles coated with a dispersant and a solvent and removing the solvent from said composition and (b) removing the solvent from the obtained thin film and (c) optionally treating the dry layer at elevated temperature.

Step (a): Application of a suspension: Many processes are known to apply a liquid composition to a substrate to result in a wet thin film; a person skilled in the art is in a position to appropriately select. Suitable are, for example coating, particularly roll-to-roll-, slot-die-, spray-, ultrasonic spray-, dip-, reel-to-reel-, blade-coating; or by printing, particularly ink-jet-, pad-, offset-, gravure-, screen-, intaglio-, sheet-to-sheet-printing. Such processes are generally considered advantageous for large scale production, when compared to vacuum-based processes. Depending on the composition used in step (a), this step may be repeated (i.e. may be performed multiple times). This embodiment is considered advantageous in order to fine tune the final film thickness.

Step (b): Drying and film formation: Many processes are known to remove a liquid from a wet thin film of a coated substrate; a person skilled in the art is in a position to appropriately select. Suitable are, for example drying at room temperature or elevated temperature. Drying may take place in air, in a protecting gas, such as nitrogen or argon. Especially suited are gases with low humidity content (e.g. nitrogen, dry air, argon).

Step (c): Temperature cleaning step: A cleaning step in the form of a temperature annealing can optionally be conducted at temperatures below 150° C. In an advantageous embodiment, the dried nanoparticle film in step (c) is annealed at 80° C.-150° C. in air or in a protecting gas.

In an advantageous embodiment, all layers of the electronic device component are manufactured by coating or printing.

Manufacturing of devices: The manufacturing of devices starting from the above described electronic device component is known per se, but not yet applied to the specific electronic device component of the present invention.

Accordingly, the invention provides a method for manufacturing an electronic device as defined herein comprising the steps of (a) providing an electronic device component as defined herein, (b) contacting the layers of said good with an electrical circuit, (d) finishing the obtained product.

Product by process: Due to the novel buffer layer obtained according to the inventive method, the electronic devices and electronic device component are also novel. Due to the outstanding stability and performance obtained according to the inventive method, the suspensions are also novel.

The invention thus provides for a suspension obtained by a method comprising the step of combining metal oxide nanoparticles, dispersant(s) and solvent(s).

The invention thus provides for an electronic device component, obtained by a method comprising the steps of applying a suspension on a substrate or coated substrate, said suspension comprising (i) metal oxide nanoparticles coated with a dispersant and (ii) a solvent and removing the solvent from said composition and optionally treating the dry layer at elevated temperature.

The invention thus provides an electronic device, obtained by a method comprising the steps of providing an electronic device component as defined herein, contacting the layers with an electrical circuit, finishing the obtained product.

In a fifth aspect, the invention relates to an electronic device, selected from the group of transistors, wherein said device comprises a substrate and a multitude of layers, wherein at least one of said layers is a channel layer, wherein said channel layer comprises metal oxide nanoparticles coated with a dispersant as described herein.

This aspect of the invention shall be explained in further detail below.

It was surprisingly found that the thin films as described herein are not only suitable in manufacturing organic electronics but also in the manufacturing of transistors and related electronic devices. It is thus possible to apply the materials and methods disclosed above (1st to 4th aspect of the invention) to this aspect of the invention.

In this aspect, the invention relates to channel layers in an electronic device such as TFT, said channel layers having a specific and beneficial composition containing a metal oxide as described in the first aspect of the invention and dispersant(s) as described in the first aspect of the invention. It was found that the present inventive compositions show beneficial properties because no post-treatment (e.g. plasma cleaning or annealing temperatures >150° C.) is required to achieve good device performance (high mobility).

In one specific embodiment, the invention provides for an electronic device selected from the group of inorganic electronics, wherein said device comprises a substrate and a multitude of layers, wherein at least one of said layers is a channel layer, wherein said channel layer comprises metal oxide nanoparticles coated with at least one dispersant, wherein said dispersant is a phosphate ester of alkyl ethers of formula (I)

RO—(C2H4O)m(C3H6O)n-H     (I)

or wherein said dispersant is a phosphate ester of block copolymers of formula (III)

RO(C2H4O)o(PES)p-H     (III)

wherein the substituents are as defined above.

In one further specific embodiment, the invention provides for a device as described herein, selected from the group of transistors.

In a further specific embodiment, the invention relates to an inorganic transistor wherein the channel material is obtained by a method as described herein or (ii) consists of metal oxide nanoparticles coated with a dispersant as described herein.

In a further specific embodiment, the invention relates to an inorganic transistor wherein the metal oxide nanoparticles are selected from the group consisting of ZnO, AZO, IZO, IGZO, and ZnSnO3.

To further illustrate the invention, the following examples are provided. These examples are provided with no intent to limit the scope of the invention.

The following ETL layers were compared against each other:

Vacuum deposited calcium (benchmark cells; no solution-processed ETL)
Sol-gel processed AZO (comparative example)
ZnO nanoparticle ETL (inventive)
AZO nanoparticle ETL (inventive)

1. Device Fabrication

OPV cells having different types of ETL layers were manufactured in the standard architecture with two different active layers. The stack layer sequence with the first active layer was as follows: Glass/ITO/PEDOT:PSS/Si-PCP-DTBT:PC(70)BM/ETL/Ag (see also FIG. 5; the Si-PCP-DTBT:PC(70)BM is denoted as "SiZZ".

The devices were processed in ambient atmosphere. Prestructured ITO coated glass substrates (Weidner Glas GmbH) were cleaned in acetone and then isopropyl alcohol. After drying, the substrates were coated with a PEDOT:PSS (VP Al 4083, Heraeus) layer (ca. 50 nm). An approximately 100 nm thick active layer was doctor bladed from a dichlorobenzene solution of Si-PCPDTBT (Fa. Konarka) and PC[70]BM ([6,6]-phenyl-C 71 butyric acid methyl ester, Solenne) in weight ratio 1:1.5. Then the ZnO/AZO layers were doctor bladed on top of the active layer and annealed at 80° C. for 5 min. The final thickness for all ZnO/AZO layers was set to 50 nm (determined by profilometry). The devices were finalized by the evaporation of an Ag (100 nm) top electrode. For reference devices, the ETL layer consisted of a vacuum deposited Ca layer (15 nm).

The stack layer sequence with the second active layer was as follows: Glass/ITO/PEDOT:PSS/CH3NH3PbI3-xClx/PC(60)BM/ETL/Ag The devices were processed in a nitrogen atmosphere in a glovebox. Prestructured ITO coated glass substrates (Weidner Glas GmbH) were cleaned in acetone and then isopropyl alcohol. After drying, the substrates were coated with a PEDOT:PSS (VP Al 4083, Heraeus) layer (ca. 50 nm). An approximately 200 nm thick active layer was spin coated from a solution of PbCl2 and CH3NH3I (molar ratio of 1:3) in dimethylformamide (total concentration of 30%). Then a solution of PC[60]BM (Solenne; 20 mg/mL in chlorobenzene) was spin-coated on top of the perovskite layer. Then a ZnO layer was spin-coated on top of the PCBM. The final thickness of the ZnO layer was set to 50 nm (determined by profilometry). The devices were finalized by the evaporation of an Ag (100 nm) top electrode. The active area of the investigated devices was 10.4 mm2. Current density-voltage (j-V) characteristics were measured with a source measurement unit from BoTest. Illumination was provided by an Oriel Sol 1A solar simulator with AM1.5G spectra at 0.1 W/cm2.

In one experiment, 6 cells were fabricated with each ETL material. Totally, 2 experiment batches were conducted. The results represent average values over all experiments and devices.

2. ZnO and AZO Nanoparticle Suspensions:

Aluminum doped Zinc oxide ("AZO") nanoparticles with a nominal composition of 2 wt % Al2O3 in ZnO were synthesized by flame spray synthesis. For the preparation of the precursor, 33 g Zn-acetate (Aldrich) and 1.9 g Al-acetylacetonate (Aldrich) was added to 200 g of 2-ethyl-hexanoic acid and dissolved by heating the mixture for 1 hour at 150° C. The obtained solution was diluted with THF 1:2 by weight. The precursor then was fed (5 ml min-1, HNP Mikrosysteme, micro annular gear pump mzr-2900) to a spray nozzle, dispersed by oxygen (7 l min-1, PanGas tech.) and ignited by a premixed methane-oxygen flame (CH4: 1.2 l min-1, O2: 2.2 l min-1). The off-gas was filtered through a glass fiber filter (Schleicher & Schuell) by a vacuum pump (Busch, Seco SV1040CV) at about 20 m3 h-1. The obtained oxide nanopowder was collected from the glass fiber filter.

For the synthesis of ZnO nanoparticles, the same procedure was followed but no Al-acetylacetonate was used in the precursor.

Figure 4:
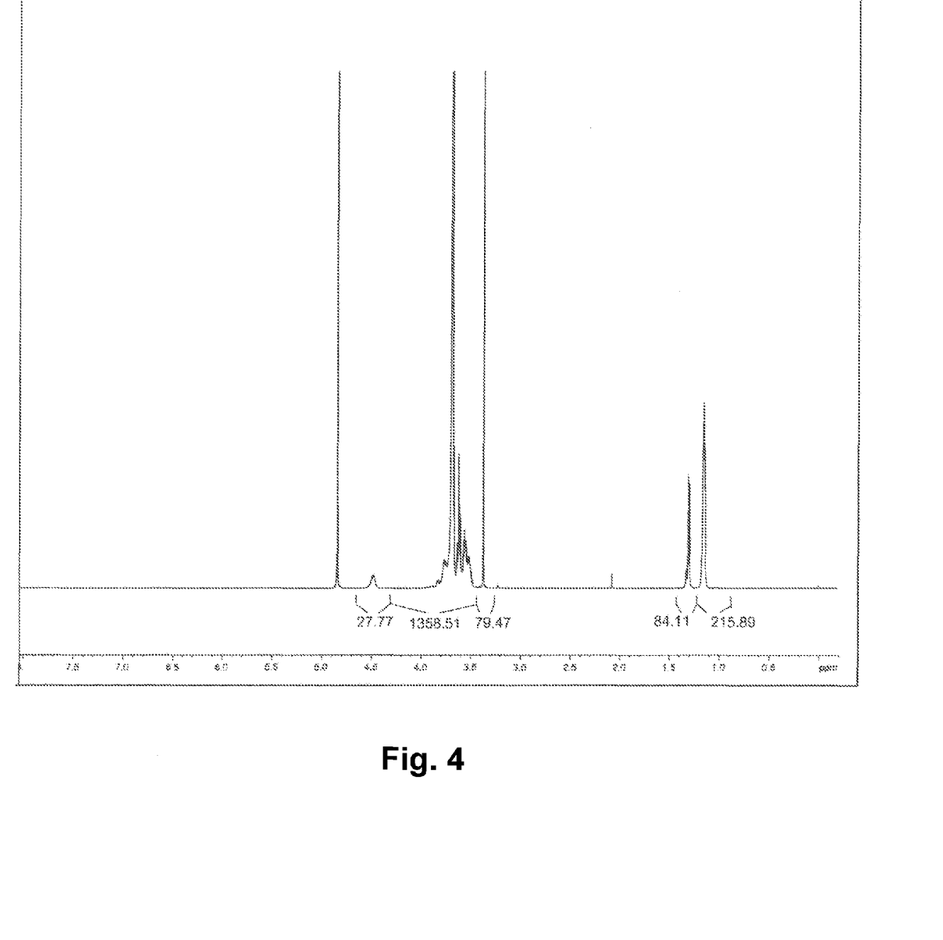
FIG. 4 is an NMR spectra (1H) of an exemplary phosphate ester dispersant in accordance with the present invention.
Figure 5:
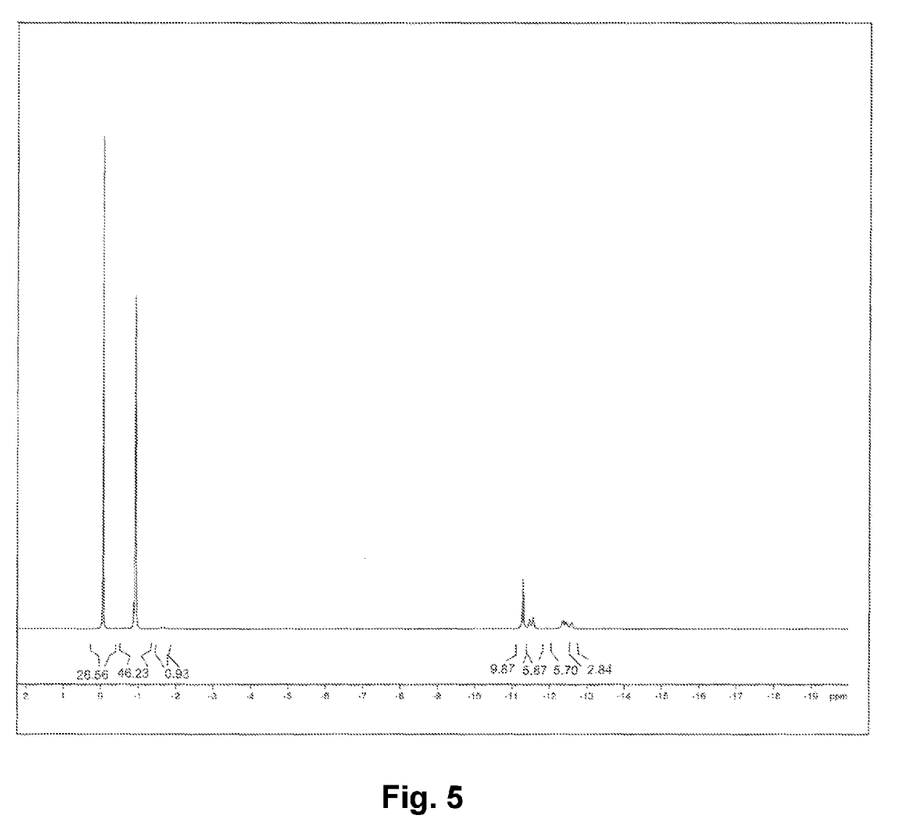
FIG. 5 is an NMR spectra (31P) of an exemplary phosphate ester dispersant in accordance with the present invention.

Suspensions with either ZnO or AZO were prepared as following:

For the preparation of suspensions, 5 wt % of nanopowder (as described above), 0.35 wt % of phosphate ester of formula (I) and 94.65 wt % of dry ethanol was dispersed by ball-milling for 6 h. NMR spectra of the phosphate ester in D2O are provided in FIGS. 4 (1H) and 5 (31P); n=8, m=3, R=Me; MW=615 g/mol.

The finally prepared suspension is transparent and stable for more than 3 months. After 3 months, the hydrodynamic particle size (D50) was determined as 15 nm for AZO and 13 nm for the pure ZnO (measured by a centrifugal particle sizer (Lumisizer)).

ZnO or AZO nanoparticle films were doctor-bladed on the organic active layer (SiZZ) resulting in homogeneous and defect-free oxide films. The thickness of the deposited oxide films was determined by profilometry. Annealing of the obtained films for 5 min at 80° C. in air resulted in high performance devices.

3. Sol-Gel AZO Coating Liquid:

An AZO sol-gel coating liquid was prepared identically to Stubhan et al. (cited above). In detail, 2.17 g Zn-acetate× H2O 0.037 g Al-nitrate×9H2O were mixed in 100 mL of ethanol. The mixture was heated at 80° C. for 3 hours and afterwards filtered through a 0.45 micron PTFE filter to remove insoluble materials.

4. Results:

The following results were obtained for the photoactive polymer material 'SiZZ'.

| ETL type | Solution processable | Fill factor (%) | Power conversion efficiency, PCE (%) |
|---|---|---|---|
| Prior art | | | |
| Ca | no | 62 | 3.7 |
| AZO sol-gel inventive | yes | 7 | 0 |
| ZnO np | yes | 55 | 3.3 |
| AZO np | yes | 57 | 3.6 |

The data show, that both inventive compositions result in high performance OPV devices, whereas sol-gel processed AZO formulations damage the active layer (=no performance).

The following results were obtained for the photoactive perovskite material.

| ETL type | Solution processable | Fill factor (%) | Power conversion efficiency, PCE (%) |
|---|---|---|---|
| inventive ZnO np | yes | 69 | 8.8 |

The data show that the inventive compositions also work well in combination with photoactive perovskite materials.

5. Buffer Layers with Haze:

In a first experiment, to provide for an AZO-suspension, AZO nanoparticles were synthesized as described in example 2. Then, a mixture of 40 wt % of AZO nanoparticles, 4 wt % Phosphat ester (as in example 2) and 56 wt % ethanol was dispersed by ball milling for 6 h. For a BaTiO3 suspension, 40 wt % BaTiO3 (200 nm particle size, purchased from Nanoamor, Product number 1148DY), 4 wt % Phosphat ester (as above) and 56 wt % Propoxy-ethanol was dispersed by ball-milling for 1 h.

Then, two weight parts of the AZO suspension was combined with one weight part of the BaTiO3 suspension. This final formulation was spin-coated onto microscope glass slide with 250 rpm and 8000 rpm. The resulting films were characterized by measuring the Haze (integrated sphere; Perkin Elmer Lambda 950), surface roughness (AFM NT-MDT Nano Educator), electrical conductivity (4-point method; R-CHECK Model RC2175) and film thickness (Profilometer; KLA Tencor Alpha-Step D100). The following results were observed:
- @ 250 rpm spin-coating speed: 41% Haze, 10'000 nm film thickness, Ra=11 nm
- @ 8000 rpm spin-coating speed: 9% Haze, 2000 nm film thickness.

In a second experiment, ITO nanoparticles were used instead of AZO nanoparticles (Alfa Aesar (ex. Nanophase), Product No. 44927), the following results were observed:
- @ 250 rpm spin-coating speed: 30% Haze, 8'800 nm film thickness, Ra=8 nm, conductivity=5 Ohm/square (226 S/cm)
- @ 8000 rpm spin-coating speed: 14% Haze, 1800 nm film thickness, Ra=10 nm, conductivity=1400 Ohm/square (3.9 S/cm).

The invention claimed is:

1. An electronic device selected from a group of organic photovoltaic devices (OPV), said electronic device comprising a substrate and a multitude of layers,
   wherein at least one of said layers is a buffer layer,
   wherein said buffer layer comprises metal oxide nanoparticles coated with at least one dispersant, wherein said dispersant is a phosphate ester of alkyl ethers of formula (I)

$$RO-(C_2H_4O)_m(C_3H_6O)_n-H \qquad (I)$$

wherein R is $C_1$-$C_{10}$-alkyl; and m and n are each, independently, 2 to 60 or wherein said dispersant is a phosphate ester of block copolymers of formula (III)

$$RO(C_2H_4O)_o(PES)_p-H \qquad (III)$$

wherein R is $C_{1-10}$-alkyl; PES is a polyester derived from a cyclic lactone; o is from 5 to 60; p is from 2 to 30; and where the molecular weight of $RO(C_2H_4O)_o$ is greater than the molecular weight of $(PES)_p$, and wherein the multitude of layers further comprises an Ag electrode in direct contact with the buffer layer.

2. The device according to claim 1, wherein said multitude of layers is arranged in normal architecture or in inverted architecture.

3. The device of claim 1, wherein said buffer layer is selected from the group consisting of hole transport (HTL), hole extraction (HEL), electron transport (ETL) and electron extraction (EEL) layers.

4. The device according to claim 1, wherein said metal oxide nanoparticles are selected from the group consisting of pure metal oxides; mixed metal oxides; and doped metal oxides;
said metal oxides optionally containing carbonaceous material.

5. The device of claim 4, wherein the pure metal oxide is at least one of ZnO, TiOx, WOx, NiO, VyOx, MoyOx and NbyOx.

6. The device of claim 4, wherein the mixed metal oxide is at least one of IGZO, IZO, and $ZnSnO_3$.

7. The device of claim 4, wherein the doped metal oxide is at least one of ITO and ATO.

8. The device of claim 1, wherein said metal oxide nanoparticles are selected from the group consisting of ZnO, Al-doped ZnO ("AZO"), ZnO containing carbonaceous material, AZO containing carbonaceous material; or
from the group consisting of TiOx and doped TiOx; or
from the group consisting of antimony doped tin oxide (ATO).

9. The device of claim 1, wherein said multitude of layers further comprises at least one layer selected from
(a) an active layer;
(b) an additional buffer layer;
(c) an inorganic conductive electrode material;
(d) an organic conductive electrode material; and
(e) a combination of (c) and (d).

10. The device of claim 9, wherein the inorganic conductive electrode material is at least one of ITO, Ag, Cu and Ni.

11. The device of claim 9, wherein the organic conductive electrode material is PEDOT:PSS.

12. An organic photovoltaic electronic device component comprising a sheet-like substrate coated with a multitude of layers, wherein said layers
(a) have the sequence: electrode/HEL/active layer/EEL/electrode ("normal architecture"); or
(b) have the sequence: electrode/EEL/active layer/HEL/electrode ("inverted architecture"); or
(c) comprise the sequence: electrode/EEL/active layer/HEL; or
(d) comprise the sequence: electrode/HEL/active layer/EEL;
wherein in each case (a) to (d) one or more of the buffer layers, HEL, EEL, as the case may be, comprises metal oxide nanoparticles selected from the group consisting of ZnO, Al-doped ZnO ("AZO"), ZnO containing carbonaceous material, AZO containing carbonaceous material, TiOx and doped TiOx; and
wherein said metal oxide nanoparticles are coated with at least one dispersant,
wherein said dispersant is a phosphate ester of alkyl ethers of formula (I)

$$RO-(C_2H_4O)_m(C_3H_6O)_n-H \qquad (I)$$

wherein R is $C_1$-$C_{10}$-alkyl; and m and n are each, independently, 2 to 60 or
wherein said dispersant is a phosphate ester of block copolymers of formula (III)

$$RO(C_2H_4O)_o(PES)_p-H \qquad (III)$$

wherein R is $C_{1-10}$-alkyl; PES is a polyester derived from a cyclic lactone; o is from 5 to 60; p is from 2 to 30; and where the molecular weight of $RO(C_2H_4O)_o$ is greater than the molecular weight of $(PES)_p$,
and wherein at least one electrode comprises an Ag electrode in direct contact with the buffer layer.

13. The component of claim 12,
wherein the buffer layer is free of scattering particles and has a thickness between 3-1000 nm or the buffer layer comprises scattering particles and has a thickness between 100-20000 nm; and/or
wherein the buffer layer has a mean surface roughness below 30 nm; and/or
wherein the buffer layer comprises additional scattering particles; and/or
wherein the substrate is selected from the group of ITO, silver, copper, nickel, PEDOT:PSS or an active layer; and/or
wherein no additional layer is present; and/or
wherein the phosphorus content is in the range of 0.005-13 wt %.

14. A method for manufacturing an electronic device component according to claim 12, wherein the buffer layer is manufactured comprising the steps of:
(a) applying a suspension on a substrate or coated substrate, said suspension comprising: (i) metal oxide nanoparticles, selected from the group consisting of pure metal oxides, mixed metal oxides, and doped metal oxides, and optionally containing carbonaceous material, the metal oxide nanoparticles coated with a dispersant, wherein said dispersant is a phosphate ester of alkyl ethers of formula (I)

$$RO-(C_2H_4O)_m(C_3H_6O)_n-H \qquad (I)$$

wherein R is $C_1$-$C_{10}$-alkyl; and m and n are each, independently, 2 to 60 or
wherein said dispersant is a phosphate ester of block copolymers of formula (III)

$$RO(C_2H_4O)_o(PES)_p-H \qquad (III)$$

wherein R is $C_{1-10}$-alkyl; PES is a polyester derived from a cyclic lactone; o is from 5 to 60; p is from 2 to 30; and where the molecular weight of $RO(C_2H_4O)_o$ is greater than the molecular weight of $(PES)_p$; and (ii) a solvent; and
(b) removing the solvent from said composition and
(c) optionally treating the dry layer at a temperature below 150° C.

15. The method of claim 14, wherein
(i) the suspension of step (a) is applied by coating or printing; and/or (ii) the dried nanoparticle film in step (c) is annealed at 80° C.-150° C. in air or in a protecting gas.

16. The method of claim 14, wherein all layers are manufactured by coating or printing.

17. A method for manufacturing an electronic device according to claim 1 comprising the steps of
    (a) providing an electronic device component comprising sheet-like substrate coated with a multitude of layers, wherein said layers
        (i) have the sequence: electrode/HEL/active layer/EEL/electrode ("normal architecture"); or
        (ii) have the sequence: electrode/EEL/active layer/HEL/electrode ("inverted architecture"); or
        (iii) comprise the sequence: electrode/EEL/active layer/HEL; or
        (iv) comprise the sequence: electrode/HEL/active layer/EEL;
    wherein in each case (i) to (iv) one or more of the buffer layers, HEL, EEL, as the case may be, contains metal oxide nanoparticles selected from the group consisting of ZnO, Al-doped ZnO ("AZO"), ZnO containing carbonaceous material, AZO containing carbonaceous material, TiOx and doped TiOx; and
    (b) contacting the layers of said component with an electrical circuit.

18. An electronic device, obtained by a method comprising the steps of
    (a) providing an electronic device component according to claim 12; and
    (b) contacting the layers of said component with an electrical circuit.

19. The electronic device according to claim 1, wherein the nanoparticles comprise aluminium doped ZnO ("AZO").

20. The electronic device according to claim 1, wherein the nanoparticles comprise SnOx.

21. The electronic device according to claim 1, wherein the nanoparticles comprise antimony doped tin oxide (ATO).

22. The electronic device according to claim 1, wherein the dispersant is as defined in formula (I).

23. The electronic device according to claim 1, wherein the substrate comprises a vacuum deposited dense Ag layer.

24. The electronic device according to claim 1, wherein the substrate comprises a solution processed porous Ag nanowire layer.

25. The electronic device according to claim 1, wherein said Ag electrode is a top electrode.

26. The electronic device according to claim 25, wherein said top electrode is a Ag-nano wire electrode.

27. The electronic device according to claim 1, wherein the substrate comprises an organic polymer.

* * * * *